(12) United States Patent
Lee et al.

(10) Patent No.: US 8,477,251 B2
(45) Date of Patent: Jul. 2, 2013

(54) DISPLAY DEVICE AND MANUFACTURING METHOD OF THE SAME

(75) Inventors: Sang-Hun Lee, Suwon-si (KR);
Byoung-Joo Kim, Anyang-si (KR);
Chul Huh, Suwon-si (KR); Gwan-Soo Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 993 days.

(21) Appl. No.: 11/939,155

(22) Filed: Nov. 13, 2007

(65) Prior Publication Data

US 2008/0239214 A1    Oct. 2, 2008

(30) Foreign Application Priority Data

Mar. 27, 2007    (KR) ........................ 10-2007-0029892

(51) Int. Cl.
*G02F 1/1335*    (2006.01)
(52) U.S. Cl.
USPC ............................... 349/12; 349/110; 349/187
(58) Field of Classification Search
USPC ................... 349/12, 106, 110, 139, 155–158, 349/160, 187; 430/7, 270.1; 345/173
See application file for complete search history.

(56) References Cited

U.S. PATENT DOCUMENTS

| 6,501,529 B1 * | 12/2002 | Kurihara et al. ............. 349/160 |
| 2007/0229734 A1 * | 10/2007 | Ho ................................ 349/106 |
| 2008/0129898 A1 * | 6/2008 | Moon ............................ 349/12 |

FOREIGN PATENT DOCUMENTS

| JP | 2001-075074 | 3/2001 |
| KR | 10-2004-0022354 | 3/2004 |
| KR | 10-2006-0020497 | 3/2006 |

\* cited by examiner

*Primary Examiner* — Uyen Chau N Le
*Assistant Examiner* — Michael Mooney
(74) *Attorney, Agent, or Firm* — H.C. Park & Associates, PLC (57) ABSTRACT

A display device includes a first substrate including pixels and sensing electrodes corresponding with the pixels, and a second substrate facing the first substrate. The second substrate includes an organic layer with a black matrix dividing the pixels and a sensing spacer opposite to the sensing electrode. The organic layer including the black matrix and the sensing spacer may be formed in a single process using organic photoresist material. A mask includes a light-intercepting pattern including slits to block a portion of ultraviolet light emitted towards a photoresist layer to form the black matrix. The mask also includes a pattern to block ultraviolet light in a region corresponding to the sensing spacer if a negative type photoresist material is used, or the mask does not block ultraviolet light in the region corresponding to the sensing spacer if a positive type photoresist material is used.

9 Claims, 8 Drawing Sheets

DISPLAY DEVICE AND MANUFACTURING METHOD OF THE SAME

CROSS REFERENCE TO RELATED APPLICATION

This application claims priority from and the benefit of Korean Patent Application No. 10-2007-0029892, filed on Mar. 27, 2007, which is hereby incorporated by reference for all purposes as if fully set forth herein.

BACKGROUND OF INVENTION

1. Field of the Invention

The present invention relates to a display device and a method for manufacturing the same, and more particularly, to a display device including a sensing spacer and a method for manufacturing the same.

2. Discussion of the Background

A display device may include a touch panel on the top surface of the display device so that a user can select execution commands displayed on a screen of the display device, such as on a liquid crystal display (LCD) panel, by applying a stimulus such as with a finger or a pen. The display device including the touch panel has been used because it does not need additional input units such as a key board or a mouse.

A built-in type touch panel can be mounted to the display panel and includes a pressure-sensitive sensor for sensing a stimulus. The pressure-sensitive sensor may include an additional element such a sensing electrode or a sensing spacer.

However, the additional element may complicate a manufacturing process of the display device.

SUMMARY OF THE INVENTION

This invention provides a display device and a simplified method for manufacturing the display device.

Additional aspects of the present invention will be set forth in part in the description which follows and, in part, will be obvious from the description, or may be learned by practice of the present invention.

The present invention discloses a display device including a first substrate having a plurality of pixels, a first pixel of the plurality of pixels including a sensing electrode, and a second substrate facing the first substrate and including an organic layer. The organic layer includes a black matrix dividing the pixels and a sensing spacer opposite to the sensing electrode. The sensing spacer is formed integrally with the black matrix.

The present invention also discloses a display device including a first substrate having a plurality of pixels, a first pixel including a sensing electrode, and a second substrate facing the first substrate and including an organic layer. The organic layer includes a black matrix dividing the pixels and a sensing spacer opposite to the sensing electrode. The sensing spacer is formed simultaneously with the black matrix.

The present invention also discloses a method for manufacturing a display device, including forming a photoresist layer on a first insulating substrate, exposing and developing the photoresist layer to form a black matrix and a sensing spacer, forming a color filter between portions of the black matrix, forming a transparent electrode layer, and forming a cell-gap spacer on a common electrode. The transparent electrode layer includes the common electrode formed on the black matrix and the color filter, and a contact electrode formed on the sensing spacer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Reference will now be made in detail to the exemplary embodiments of the present invention as shown in the accompanying drawings.

Figure 1:
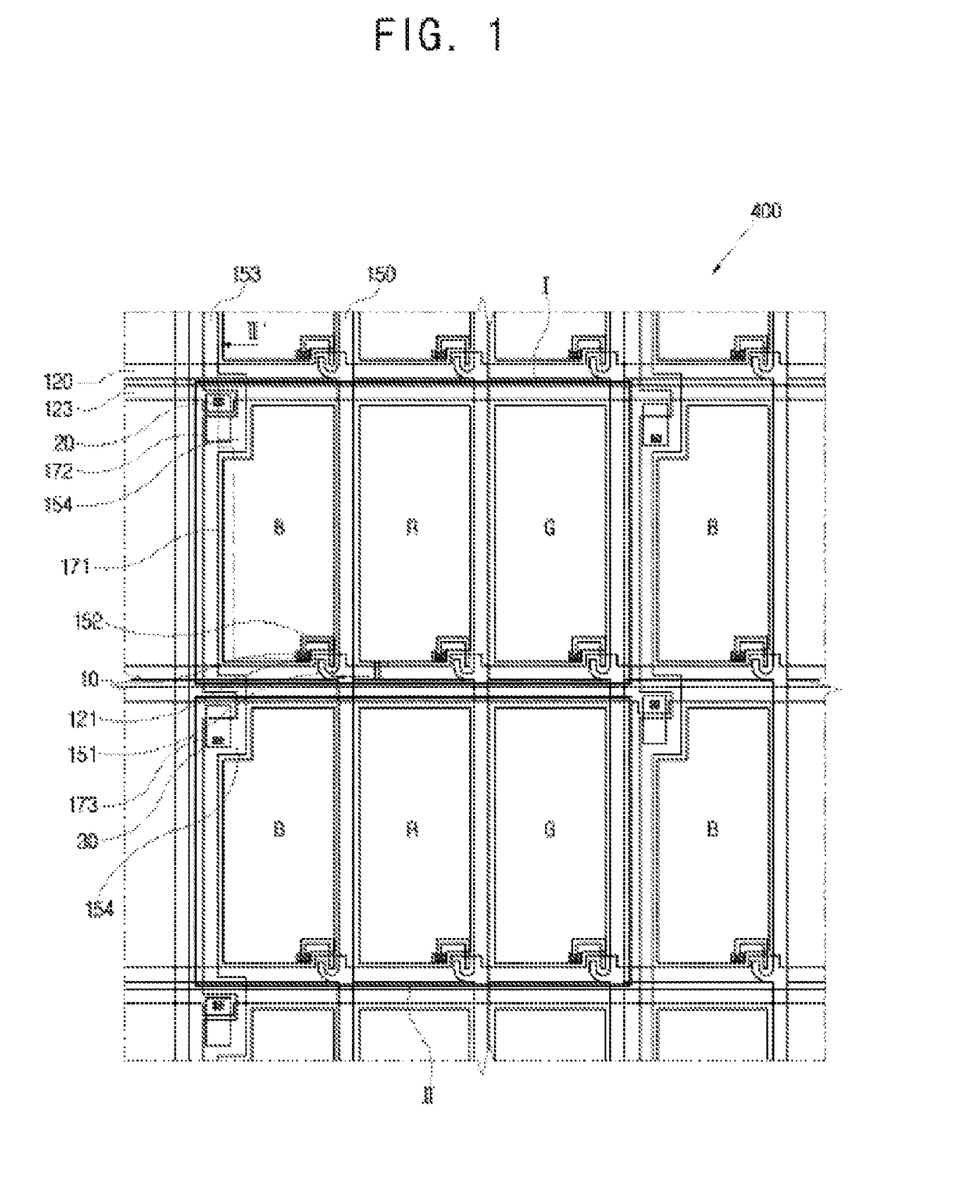
FIG. 1 is a plan view of a display device according to an exemplary embodiment of the present invention.
Figure 2:
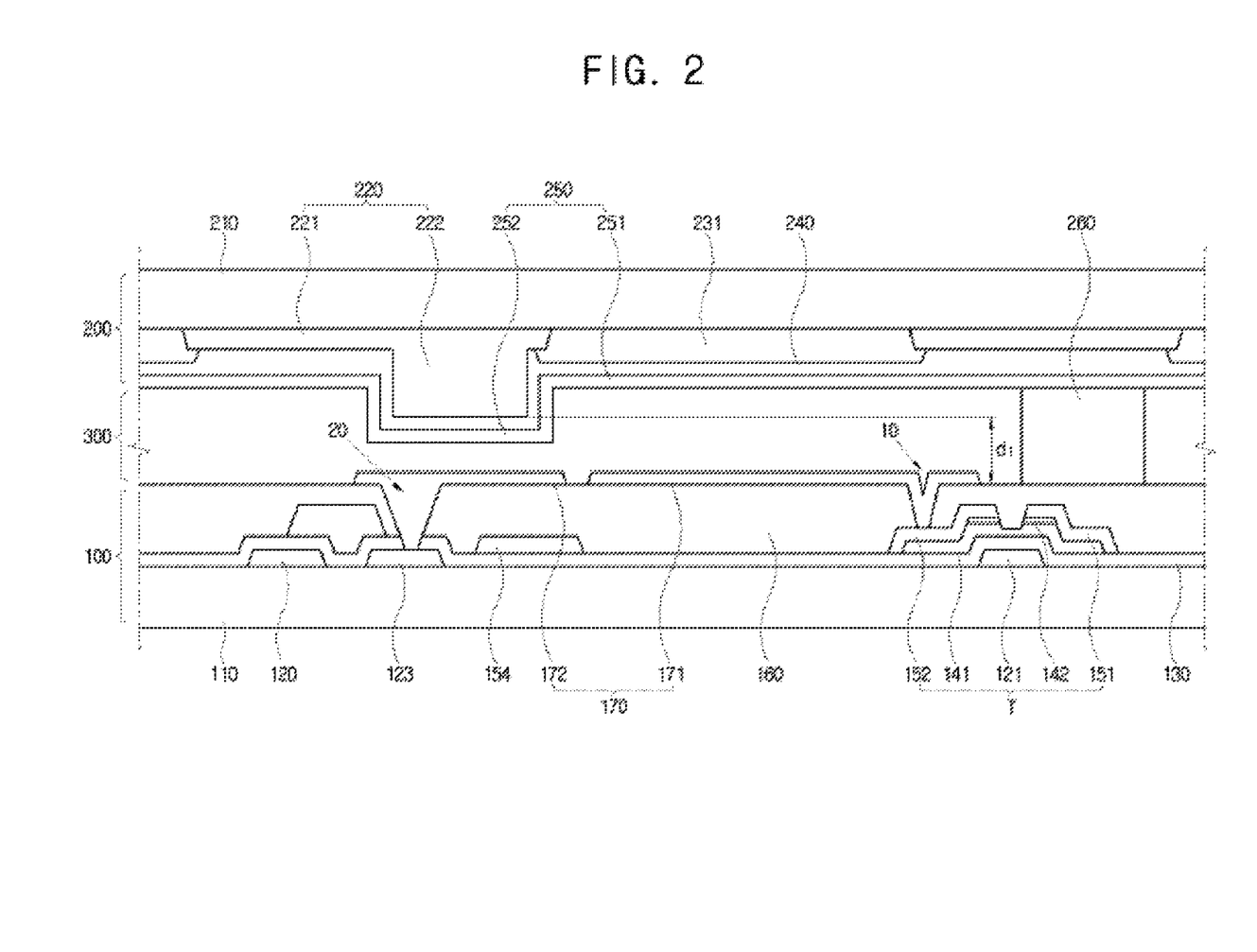
FIG. 2 is a section view taken along line II'-II' of FIG. 1.

FIG. 1 is a plan view of a display device according to an exemplary embodiment of the present invention, and FIG. 2 is a section view taken along line II'-II' of FIG. 1.

A display device according to an exemplary embodiment of the present invention includes a touch panel for responding to a command applied by an external stimulus. In this exemplary embodiment, the display device includes a built-in type touch panel in which a Y sensing electrode 172 and an X sensing electrode 173 for sensing pressure are internally provided in a display panel 400. The Y sensing electrode 172 and the X sensing electrode 173 shall be collectively referred to as the sensing electrodes 172 and 173.

The display panel 400 includes a first substrate 100 including a first main pixel I and a second main pixel II, a second substrate 200 facing the first substrate 100, and a liquid crystal layer 300 interposed between the first substrate 100 and the second substrate 200. The first main pixel I and the second main pixel II shall be collectively referred to as the main pixels I and II.

On the first substrate 100, the main pixels I and II are arranged in a matrix shape. The first main pixel I and the second main pixel II each include a red sub-pixel R, a green sub-pixel G, a blue sub-pixel B, and one of the sensing electrodes 172 and 173. For example, the first main pixel I may have a Y sensing electrode 172, and the second main pixel II may have an X sensing electrode 173. The first main pixel I and the second main pixel II are arranged adjacent each other. Further, the first main pixel I and the second main pixel II are alternately arranged such that the Y sensing electrode 172 and the X sensing electrode 173 are alternately arranged.

The red sub-pixel R, the green sub-pixel G, and the blue sub-pixel B each may be shaped like a rectangle. Each red sub-pixel R, green sub-pixel G, and blue sub-pixel B includes a thin film transistor T, and a pixel electrode 171 connected to the thin film transistor T.

According to an exemplary embodiment of the present invention, the display panel 400 may be a one-point contact type display device whereby each of the main pixels I and II includes one of the sensing electrodes 172 and 173. In other words, the Y sensing electrode 172 for obtaining Y position information and the X sensing electrode 173 for obtaining X position information are not both arranged in a single one of the main pixels I or II. The one-point contact type display device may offer improved symmetry over a two-point contact type display device or a three-point contact type display device in which two, three, or more sensing electrodes are arranged in one of the main pixels I or II, respectively. Further, in a two-point contact type display device or a three-point contact type display device, more than one sensing electrode may simultaneously respond to an applied stimulus to detect a position of the applied stimulus. This may cause the applied stimulus position to be incorrectly detected if any one of the sensing electrodes does not respond to the applied stimulus. Conversely, with a one-point contact type display device, a sensing signal may be transmitted as long as only one of the sensing electrodes 172 and 173 responds to an external stimulus, so that sensitivity to the stimulus is improved.

The sizes of the main pixels I and II may be small compared to the area of the external stimulus such that the X sensing electrode 173 and the Y sensing electrode 172 both respond to the stimulus even though they are not arranged in a single one of the main pixels I and II.

However, application of the present invention is not limited to the one-point contact type display device, and may be applied to a two-point contact type display device or a three-point contact type display device.

Alternatively, the first main pixel I and the second main pixel II may be arranged with a predetermined distance therebetween. That is, a pixel excluding the sensing electrodes 172 and 173 may be arranged between the first main pixel II and the second main pixel II.

Referring to the first substrate 100, a gate wiring line 120, 121 and 123 is arranged on a first insulating substrate 110. The gate wiring line 120, 121 and 123 may be formed of metal as a single layer or a multi layer. The gate wiring line 120, 121, 123 includes a gate line 120 extended in a first direction, a gate electrode 121 extending from the gate line 120, and the Y sensing line 123 arranged in parallel with the gate line 120. Further, the gate wiring line 120, 121 and 123 may include a storage electrode line (not shown) overlapping with a pixel electrode 171 and forming a storage capacitor.

The gate line 120 and the Y sensing line 123 are arranged in parallel with each other, but the present invention is not limited thereto. Alternatively, the gate line 120 and the Y sensing line 123 may be not parallel with each other, or portions of the gate line 120 and the Y sensing line 123 may be parallel with each other.

The Y sensing line 123 is a channel for a signal, such as a current or voltage signal, that is generated if pressure or a stimulus is applied to the Y sensing electrode 172. The Y sensing line 123 provides a signal that may be used, for example, by an external driver (not shown) to determine a position of the applied pressure or stimulus.

On the first insulating substrate 110, the gate wiring line 120, 121 and 123 is covered with a gate insulating layer 130 formed of an insulating material such as silicon nitride (SiNx).

Further, a semiconductor layer 141 formed of a semiconductor material such as amorphous silicon or polysilicon is arranged on the gate insulating layer 130, and an ohmic contact layer 142 including silicide or n+ hydrogenated amorphous silicon highly doped with n-type impurities is arranged on the semiconductor 141.

A data wiring line 150, 151, 152, 153 and 154 is arranged on the ohmic contact layer 142 and the gate insulating layer 130. The data wiring line 150, 151, 152, 153 and 154 may be formed of metal as a single layer or multi-layers. The data wiring line 150, 151, 152, 153 and 154 includes a data line 150 arranged in a second direction and crossing with and insulated from the gate line 120 to define a pixel region, a source electrode 151, a drain electrode 152, an X sensing line 153 arranged in parallel with the data line 150 and crossing with and insulated from the Y sensing line 123, and an extended part 154 arranged corresponding to the Y sensing electrode 172 and the X sensing electrode 173.

The source electrode 151 extends from the data line 150, and the drain electrode 152 is connected to the pixel electrode 171 via a contact hole 10.

The X sensing line 153 is a channel for a signal, such as a current or voltage signal, that is generated if pressure or a stimulus is applied to X sensing electrode 173. The X sensing line 153 provides a signal that may be used, for example, by an external driver (not shown) to determine a position of the applied pressure or stimulus.

The extended part 154 extends from the X sensing line 153 and is arranged under each of the sensing electrodes 172 and 173. The extended part 154 arranged under the Y sensing electrode 172 renders a gap between the Y sensing electrode 172 and a contact electrode 252 of the second substrate 200 more uniform with a gap between the X sensing electrode 173 and the contact electrode 252. If the gap between the Y sensing electrode 172 and a contact electrode 252 of the second substrate 200 and the gap between the X sensing electrode 173 and the contact electrode 252 are maintained more uniformly, there is a step difference between the sensing electrodes 172 and 173 when a pressure or stimulus is simultaneously applied to the X sensing electrode 173 and the Y sensing electrode 172, thereby enhancing responsiveness to the applied pressure or stimulus. Further, a sensing spacer 222 is arranged corresponding with the Y sensing electrode 172 in a region corresponding with the extended part 154.

The Y sensing electrode 172 is connected to the Y sensing line 123 via a contact hole 20, so that the extended part 154 arranged under the Y sensing electrode 172 may be omitted in a region corresponding to the contact hole 20. The X sensing electrode 173 is connected to the extended part 154 via a contact hole 30.

According to an exemplary embodiment of the present invention, the extended part 154 may be arranged in a pixel region for a blue sub-pixel B, so that an aperture ratio of the blue sub-pixel B is smaller than an aperture ratio of the red sub-pixel R and the green sub-pixel G. Because blue light may have lower visibility than red light and green light, an observer viewing a displayed image on the display device may not recognize the decrease of blue light even though the aperture ratio of the blue sub-pixel B is smaller than that of the red sub-pixel R and the green sub-pixel G. Thus, if the sensing electrodes 172 and 173 decrease an aperture ratio of one among the red sub-pixel R, the green sub-pixel G, and the blue sub-pixel B, the sensing electrodes 172 and 173 may be arranged in the blue sub-pixel B to maintain the aperture ratio of the red sub-pixel R and the green sub-pixel G.

A passivation layer 160 is arranged on the data wiring line 150, 151, 152, 153, and 154, and on the semiconductor layer 141 exposed between the data wiring line 150, 151, 152, 153, and 154. The passivation layer 160 includes contact holes 10, 20 and 30, through which the drain electrode 152, the Y sensing line 123, and the extended part 154 are exposed, respectively.

The pixel electrode 171, the Y sensing electrode 172, and the X sensing electrode 173 are arranged on the passivation layer 160. The pixel electrode 171 may be formed of a transparent conductive material such as indium tin oxide (ITO) or indium zinc oxide (IZO). Also, the sensing electrodes 172 and 173 may be formed of a transparent conductive material on the same layer with the pixel electrode 171. Because of arrangement of the sensing electrodes 172 and 173 in the blue sub-pixel B, the pixel electrode 171 in the blue sub-pixel B may be smaller in area than a pixel electrode 171 in the red sub-pixel R and a pixel electrode 171 in the green sub-pixel G.

When an external stimulus is provided, the contact electrode 252 contacts the Y sensing electrode 172 and the X sensing electrode 173. The Y sensing electrode 172 and the X sensing electrode 173 each may have an area large enough to easily contact the contact electrode 252. Thus, the area of the Y sensing electrode 172 may be equal to or larger than the area of the contact electrode 252. Similarly, the area of the X sensing electrode 173 may be equal to or larger than the area of the contact electrode 252. However, the area of the Y sensing electrode 172 and the area of the X sensing electrode 173 may not be significantly larger than the area of the contact electrode 252 to avoid decreasing the aperture ratio significantly.

Further, the area of the Y sensing electrode 172 may be equal to or different than the area of the X sensing electrode 173. A ratio of the area of the Y sensing electrode 172 to the area of the X sensing electrode 173 may vary depending on the areas of the contact electrode 252 and the pixel electrode 171.

Below, the second substrate 200 will be described.

An organic layer 220 including a black matrix 221 and the sensing spacer 222 is arranged on a second insulating substrate 210. The organic layer 220 may be formed of an organic photoresist material with a black pigment. Here, carbon black, titanium oxide, or another similar material may be used as the black pigment. The black matrix 221 may divide a red color filter, a green color filter, and a blue color filter of a color filter layer 231. The black matrix 221 blocks light emission in a region of the second insulating substrate 210 corresponding to the thin film transistor T provided on the first substrate 100. The sensing spacer 222 is arranged opposite to the sensing electrodes 172 and 173 of the first substrate 100 and transfers an applied stimulus from the second substrate 200 to the first substrate 100.

In a built-in type touch panel that includes the first substrate 100 of the display panel with sensing electrodes 172 and 173 to sense the applied stimulus and the second substrate 200 with the sensing spacer 222, an additional process for forming the sensing spacer 222 may be included. The sensing spacer 222 may be formed by patterning using a mask in a separate patterning process as the processes for forming a black matrix or a cell-gap spacer. Here, the patterning typically includes exposing and developing a photoresist material. However, the display device according to the present exemplary embodiment includes the sensing spacer 222 arranged on the same layer with the black matrix 221. In other words, the sensing spacer 222 and the black matrix 221 may be simultaneously formed by the same patterning process. Thus, the sensing spacer 222 together with the black matrix 221 is formed to contact the second insulating substrate 210.

Further, the sensing spacer 222 and the black matrix 221 may be formed as a single body. When the sensing spacer 222 is formed integrally with the black matrix 221 on the second insulating substrate 210, the strength of the sensing spacer 222 may increase. That is, the elasticity of the sensing spacer 222 may increase, so that a more efficient response to the stimulus may occur.

Meanwhile, to eliminate a separate step of forming the sensing spacer 222, there are methods of forming the sensing spacer 222 while forming the cell-gap spacer 260 or forming the sensing spacer 222 by overlapping the color filter layers 231. In the former case, additional patterning may be included for forming a contact electrode on the sensing spacer 222. In the latter case, it may be difficult to control the height of the sensing spacer 222. On the other hand, according to exemplary embodiments of the present invention, the sensing spacer 222 and the black matrix 221 are simultaneously formed so that the process is simple, and it is easier to control the height of the sensing spacer 222.

A color filter layer 231 is arranged on the second insulating substrate 210 in a region corresponding to the pixel electrode 171 and between portions of the black matrix 221. As described above, the color filter layer 231 may include a red color filter, a green color filter, and a blue color filter, which are repeatedly patterned with black matrix 221 arranged therebetween. The color filter layer 231 filters color from light emitted from a backlight unit (not shown) connected to the display device and passing through the liquid crystal layer 300. The color filter layer 231 may be formed of an organic photoresist material. Alternatively, the color filter layer 231 may be formed on the first substrate 100. Further, the color filter layer 231 may be omitted according to a driving method of the backlight unit or an intended use of the display device.

An overcoat layer 240 is arranged on the color filter layer 231, the black matrix 221 exposed between color filter layers 231, and the sensing spacer 222. The overcoat layer 240 planarizes and protects the color filter layer 231. An acrylic epoxy material may be used as the overcoat layer 240.

A transparent electrode layer 250 is arranged on the overcoat layer 240. The transparent electrode layer 250 includes a common electrode 251 and the contact electrode 252. The transparent electrode layer 250 may be formed of a transparent conductive material such as indium tin oxide (ITO) or indium zinc oxide (IZO). The common electrode 251 is disposed corresponding to the color filter layer 231 and the black matrix 221, and the contact electrode 252 is disposed corresponding to the sensing spacer 222. The transparent electrode layer 250 receives a common voltage. A potential difference between the common electrode 251 and the pixel electrode 171 of the first substrate 100 generates an electric field that is applied to the liquid crystal layer 300 interposed between the first substrate 100 and the second substrate 200. Liquid crystal molecules align themselves in response to the applied electric field, and light transmissivity through the liquid crystal layer 300 depends on the alignment of the liquid crystals in the liquid crystal layer 300.

When the external stimulus is provided to the sensing electrodes 172 and 173, the contact electrode 252 receiving the common voltage contacts one of the sensing electrodes 172 and 173 so that the common voltage is applied to an external driver via one of the sensing electrodes 172 and 173 and a corresponding Y sensing line 123 or X sensing line 153. Then, the driver determines a position in the main pixels I and II from which the electric signal is transmitted, thereby establishing the position at which the stimulus is provided.

To facilitate contact between the contact electrode 252 and the Y sensing electrode 172 and between the contact electrode 252 and the X sensing electrode 173, the contact electrode 252 may be arranged in a region of a pixel area corresponding to the respective center part of the Y sensing electrode 172 or the X sensing electrode 173.

A cell-gap spacer 260 is arranged on the transparent electrode layer 250 to maintain a cell gap between the first substrate 100 and the second substrate 200. The cell-gap spacer 260 corresponds to the thin film transistor T of the first substrate 100. The cell-gap spacer 260 maintains a more uniform distance between the first substrate 100 and the second substrate 200 so that liquid crystal layer 300 is stably disposed between the first substrate 100 and the second substrate 200. The sensing spacer 222 is separated from the first substrate 100 by a distance d1 so that the sensing spacer 222 does not contact the sensing electrodes 172 and 173 except if the stimulus is provided. Thus, the cell-gap spacer 260 is higher than the sensing spacer 222. More specifically, the cell-gap spacer 260 extends further from the second insulating substrate 210 than the sensing spacer 222 to be closer to the first substrate 100 than the sensing spacer 222. The height difference between the cell-gap spacer 260 and the sensing spacer 222 corresponds to the distance d1. For example, the distance d1 may be about 0.2 μm to about 1 μm, or about 0.2 μm to about 0.35 μm.

FIG. 3A, FIG. 3B, FIG. 3C, and FIG. 3D illustrate a method for manufacturing a display device according to an exemplary embodiment of the present invention, and more specifically, a method for manufacturing a second substrate.

Figure 3A:
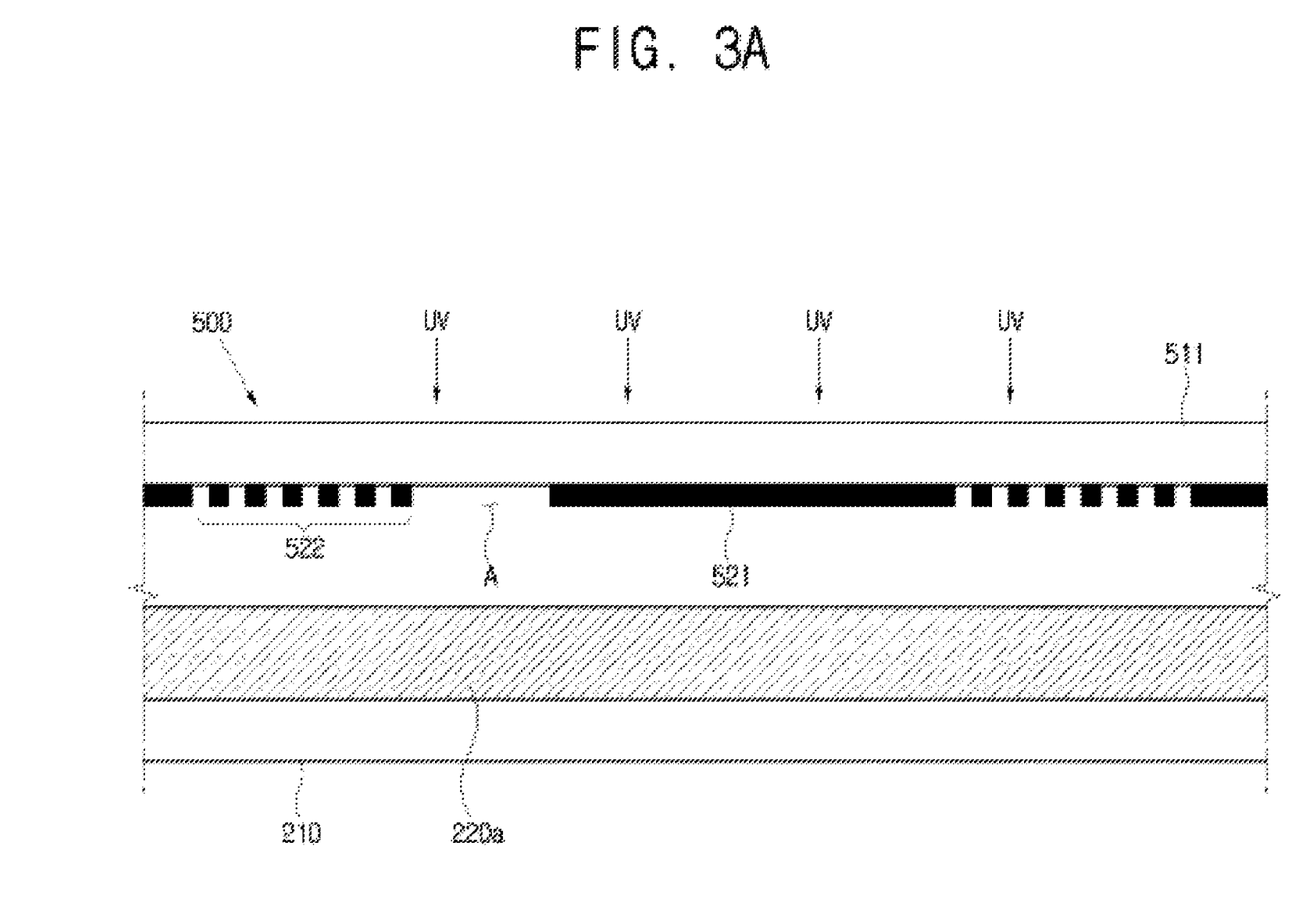
FIG. 3A, FIG. 3B, FIG. 3C, and FIG. 3D illustrate a method for manufacturing a display device according to an exemplary embodiment of the present invention.

First, a photoresist solution for black matrix is made by adding a black pigment to an organic photoresist material. The black pigment may include carbon black or titanium oxide. The photoresist material is applied to the second insulating substrate 210 to form a photoresist layer 220a. The photoresist layer 220a may be formed by spin coating, nozzle coating, or screen-printing, for example. Then, the photoresist layer 220a is exposed as shown in FIG. 3A.

A mask 500 to be used in exposing the photoresist layer 220a includes a mask substrate 511, a first light-intercepting pattern 521 and a second light-intercepting pattern 522 arranged on the mask substrate 511. Collectively, the first light-intercepting pattern 521 and the second light-intercepting pattern 522 may be referred to as the light-intercepting patterns 521 and 522. The mask substrate 511 may include quartz, and the light-intercepting patterns 521 and 522 may include chrome and/or chrome oxide. The light-intercepting patterns 521 and 522 are formed as follows.

The light-intercepting patterns 521 and 522 are not arranged in a transmission region A of the mask 500. Transmission region A may correspond to the sensing spacer 222 arranged on the first substrate 100. That is, the transmission region A transmits approximately 100% of ultraviolet ("UV") light emitted toward the photoresist layer 220a to expose and develop the photoresist layer 220a. The second light-intercepting pattern 522 corresponding to a region for the black matrix 221 may include a series of slits to transmit some but not all of the UV light towards the photoresist layer 220a. The first light-intercepting pattern 521, corresponding to the region where the color filter layer 231 will be formed, intercepts approximately 100% of the UV light.

Figure 3B:
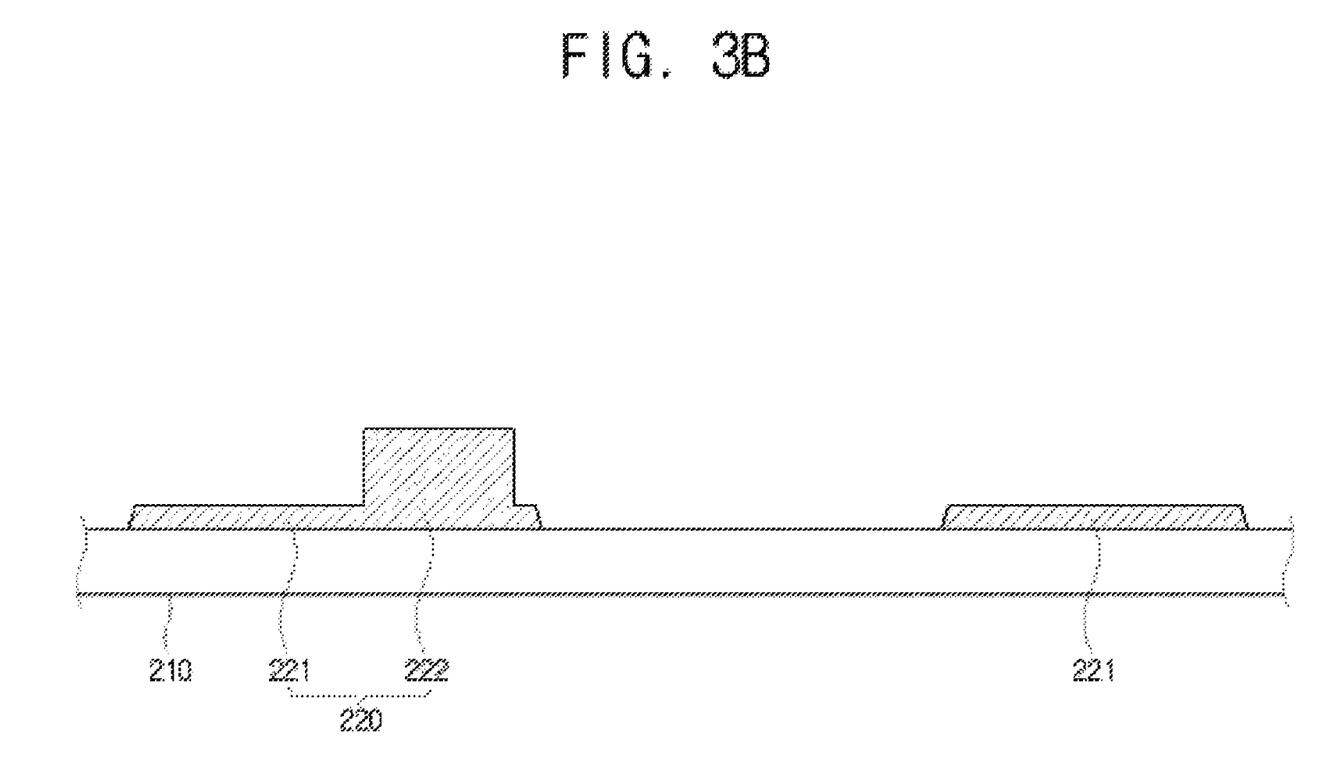

FIG. 3B shows the organic layer 220 formed by exposing and developing the photoresist layer 220a. The organic layer 220 includes the sensing spacer 222 formed in the transmission region A, and the black matrix 221 formed corresponding to the second light-intercepting pattern 522. In this exemplary embodiment, the photoresist layer 220a may be a negative type photoresist material whereby the exposed photoresist remains on the substrate as an organic layer.

Figure 3C:
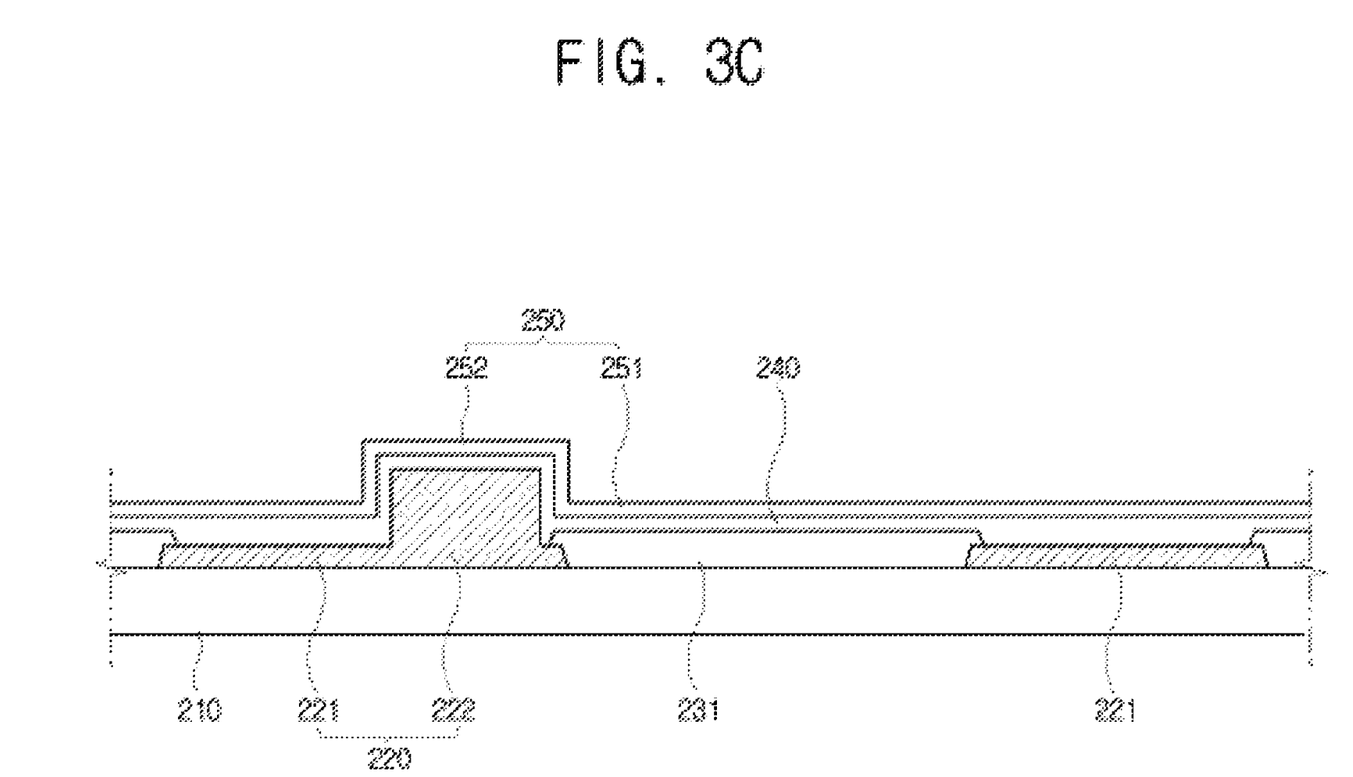

Then, as shown in FIG. 3C, the color filter layer 231 is formed between portions of the black matrix 221, and the overcoat layer 240 and the transparent electrode layer 250 are formed on the color filter layer 231. Compositions of different colors may be applied, exposed, developed and baked respectively so as to form the color filter layer 231. The transparent electrode layer 250 may be formed by depositing the transparent conductive material such as indium tin oxide (ITO) or indium zinc oxide (IZO) by a sputtering method. The transparent electrode layer 250 may not undergo a separate patterning process.

Figure 3D:
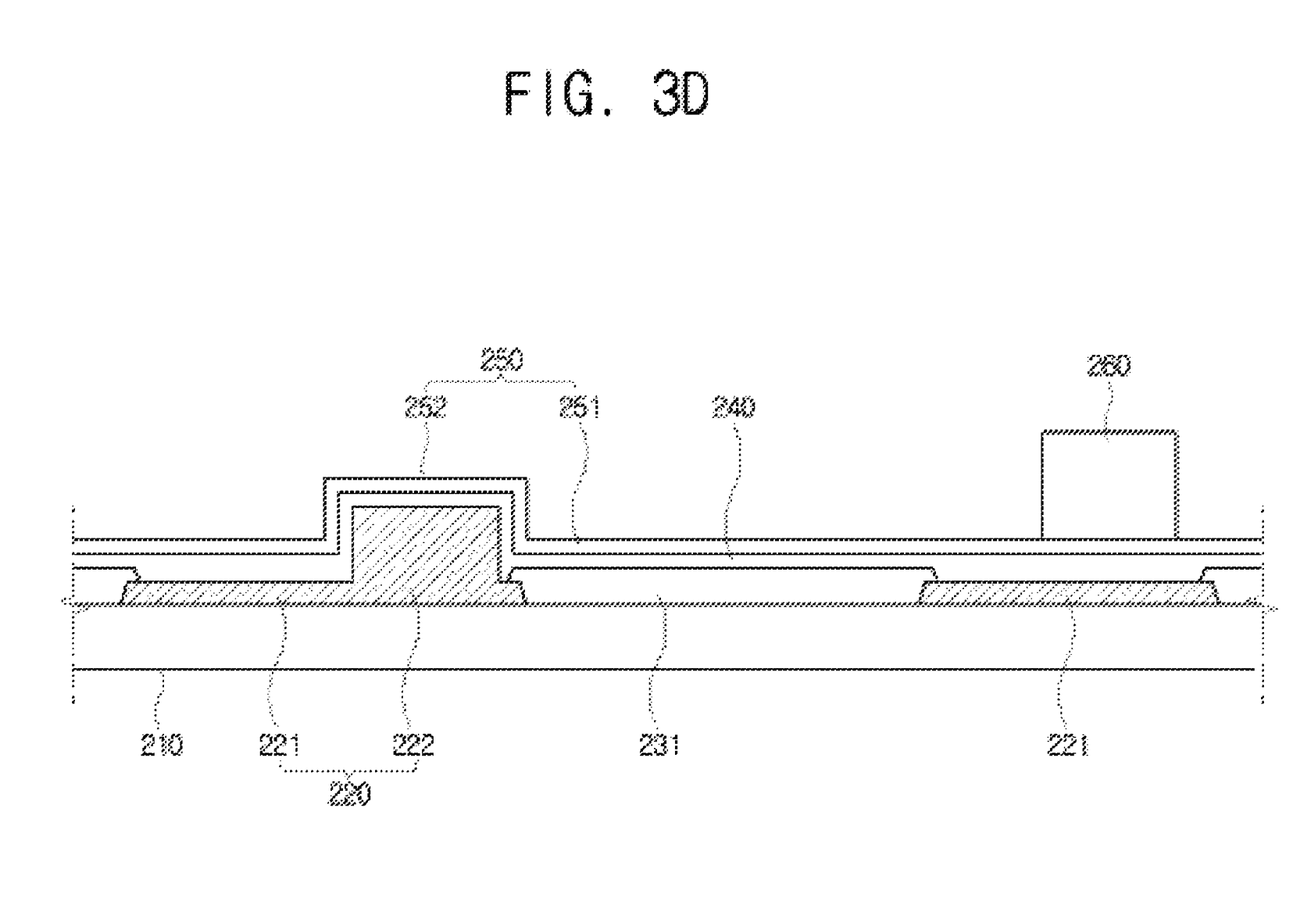

Then, as shown in FIG. 3D, the cell-gap spacer 260 is formed on the transparent electrode layer 250 in order to maintain the cell gap between the first substrate 100 and the second substrate 200 in the liquid crystal display device. The cell-gap spacer 260 is formed by applying, exposing, developing and baking a cell-gap spacer material on the transparent electrode layer 250.

The method for manufacturing the first substrate 100 is not limited and may include any method for manufacturing a first substrate 100 to be connected to the second substrate 200 to form a display device.

A sealant (not shown) is applied along a circumference of the second substrate 200, and then the liquid crystal layer 300 is formed by a dropping method. The first substrate 100 and the second substrate 200 are assembled and then the sealant is cured. At this time, the sensing spacer 222 of the second substrate 200 corresponds to the sensing electrodes 172 and 173 of the first substrate 100 in the assembled liquid crystal display device. In another exemplary embodiment, the liquid crystal layer 300 may be formed by a filling or injection method instead of the dropping method.

Figure 4:
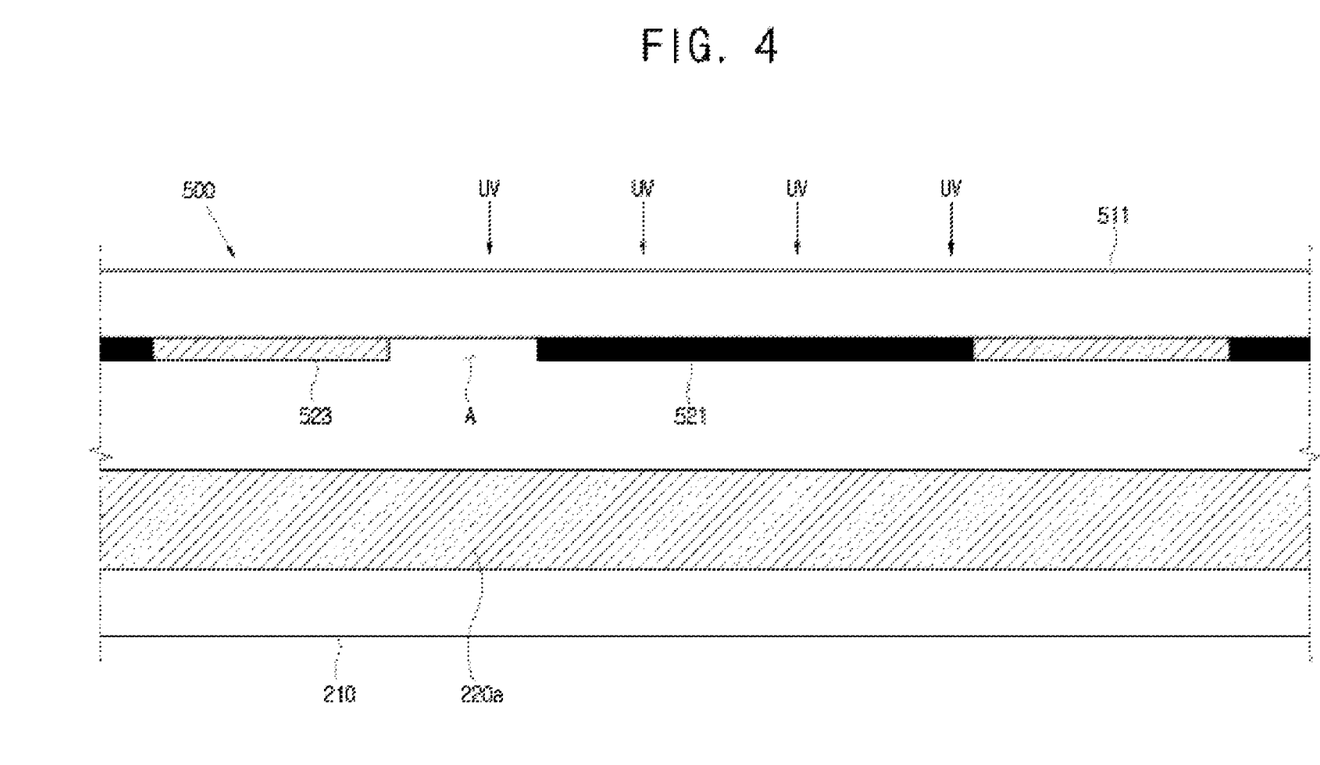
FIG. 4 illustrates a method for manufacturing a display device according to another exemplary embodiment of the present invention.

FIG. 4 illustrates a method for manufacturing a display device according to another exemplary embodiment of the present invention.

As shown in FIG. 4, a semitransparent layer 523 may be provided on the mask 500 in a region corresponding to a region where the black matrix 221 is formed in the photoresist layer 220a. Here, the semitransparent layer 523 may include MoSi or a similar semitransparent material.

Figure 5:
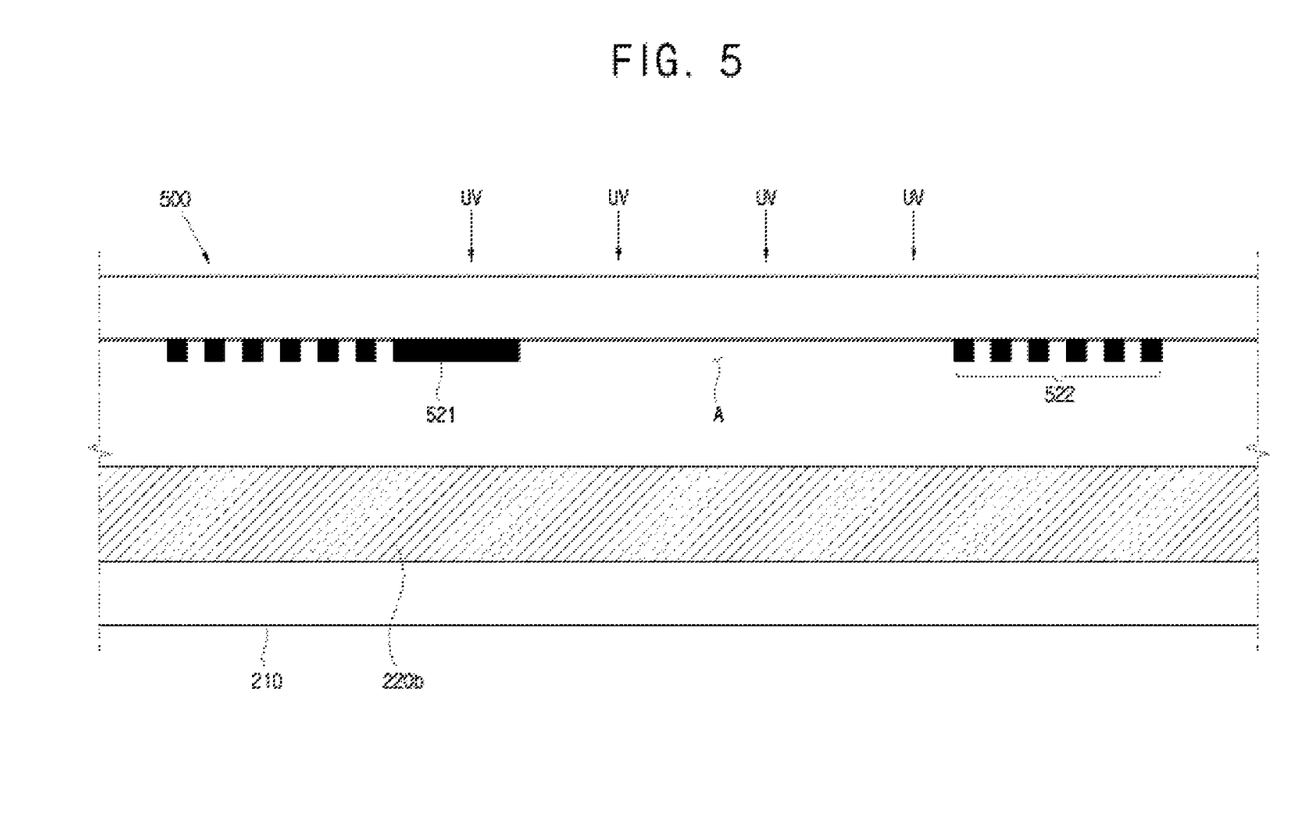
FIG. 5 illustrates a method for manufacturing a display device according to another exemplary embodiment of the present invention.

FIG. 5 illustrates a method for manufacturing a display device according to another exemplary embodiment of the present invention.

In the above-described manufacturing method, the photoresist layer 220a is a negative type photoresist material whereby a part exposed to UV light remains on a substrate. In the present exemplary embodiment described with reference to FIG. 5, a positive type photoresist layer 220b is used, in which a portion exposed to UV light is removed from a substrate.

In this case, the light-intercepting patterns 521 and 522 of the mask 500 are reversed from the mask 500 shown in FIG. 3A. That is, the mask 500 to be used in exposing the photoresist layer 220b shown in FIG. 5 includes a mask substrate 511 and light-intercepting patterns 521 and 522 arranged on the mask substrate 511. The first light-intercepting pattern 521 is arranged in region corresponding to the sensing spacer 222 arranged on the first substrate 100, and completely blocks UV light. The second light-intercepting pattern 522 corresponding to a region for the black matrix 221 includes a series of slits to permit some but not all of the UV light to pass through to the photoresist layer 220b. Transparent region A does not include the light-intercepting patterns 521 and 522. The positive type photoresist layer 220b may have improved step coverage as compared with the negative type photoresist layer 220a.

According to the exemplary embodiments, the black matrix 221 and the sensing spacer 222 are formed on the same layer by single patterning process, thereby simplifying the process. In another exemplary embodiment, the black matrix 221, the sensing spacer 222 and the cell-gap spacer 260 may be formed on the same layer by a single patterning process. In another exemplary embodiment, the sensing spacer 222 and the cell-gap spacer 260 may be formed on the same layer by single patterning process, while the black matrix 221 is formed by a different patterning process.

As described above, the present invention provides a display device and a simplified manufacturing method.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
a first substrate comprising a plurality of pixels, at least one of the plurality of pixels comprising a sensing electrode;
a second substrate facing the first substrate and comprising an organic layer, the organic layer comprising a black matrix dividing the pixels and a sensing spacer corresponding to the sensing electrode, and the sensing spacer comprising a contact electrode formed thereon facing the sensing electrode; and
a cell-gap spacer in contact with at least one of the first substrate and the second substrate,
wherein the sensing spacer extends from the black matrix as a single body with a height to maintain the contact electrode separated from the sensing electrode without an external force and to maintain the contact electrode in contact with the sensing electrode in response to an external force.

2. The display device of claim 1, wherein the second substrate further comprises an insulating substrate on which the black matrix and the sensing spacer are arranged.

3. The display device of claim 1, wherein the second substrate further comprises:
a color filter arranged between portions of the black matrix; and
a transparent electrode layer comprising a common electrode arranged on the black matrix and the color filter, and the contact electrode arranged on the sensing spacer.

4. The display device of claim 3, wherein the transparent electrode layer receives a common voltage.

5. The display device of claim 3, wherein the cell-gap spacer is arranged on the common electrode.

6. The display device of claim 1, wherein the cell-gap spacer has a height greater than the height of the sensing spacer, and a height difference between the sensing spacer and the cell-gap spacer is about 0.2 um to about 1 um.

7. A method for manufacturing a display device, comprising:
forming a sensing electrode on a first insulating substrate;
forming a photoresist layer on a second insulating substrate;
exposing and developing the photoresist layer to simultaneously form a black matrix and a sensing spacer;
forming a color filter between portions of the black matrix;
forming a transparent electrode layer, the transparent electrode layer comprising a common electrode formed on the black matrix and the color filter, and a contact electrode formed on the sensing spacer; and
forming a cell-gap spacer on the common electrode,
wherein the sensing spacer extends from the black matrix as a single body with a height to maintain the contact electrode separated from the sensing electrode without an external force and to maintain the contact electrode in contact with the sensing electrode in response to an external force.

8. The method of claim 7, wherein the photoresist layer is a negative or positive type photoresist material.

9. The method of claim 7, further comprising:
assembling the first insulating substrate and the second insulating substrate, the sensing electrode being disposed corresponding to the sensing spacer; and
forming a liquid crystal layer between the first insulating substrate and the second insulating substrate.

* * * * *